United States Patent [19]
Fujikawa et al.

[11] Patent Number: 4,798,082
[45] Date of Patent: Jan. 17, 1989

[54] CONTROL-DISPLAY DEVICE FOR AN ENGINE-EQUIPED APPARATUS

[75] Inventors: Tetsuzo Fujikawa, Kobe; Yoichi Yamaguchi; Akira Takahashi, both of Akashi, all of Japan

[73] Assignee: Kawasaki Jukogyo Kabushiki Kaisha, Kobe, Japan

[21] Appl. No.: 101,185

[22] Filed: Sep. 25, 1987

[30] Foreign Application Priority Data

Sep. 29, 1986 [JP] Japan ................................ 61-230870

[51] Int. Cl.$^4$ ........................................... G01M 15/00
[52] U.S. Cl. .................................... 73/117.3; 290/51; 340/870.16; 439/219
[58] Field of Search ............................ 73/117.3, 116, ; 290/1 A, 1 B, 51; 123/198 DC; 340/500, 870.16; 439/54, 912, 219

[56] References Cited

U.S. PATENT DOCUMENTS 3,395,574 8/1968 Mazurkevics et al. ................. 73/116
3,960,011 6/1976 Renz et al. ............................ 73/116

*Primary Examiner*—Jerry W. Myracle
*Attorney, Agent, or Firm*—Marshall, O'Toole, Gerstein, Murray & Bicknell

[57] ABSTRACT

An engine-equipped apparatus including a control-display device which contains computing circuits into which is fed such data as the AC amperage data from an apparatus having an AC generator, and devices for displaying the data converted by these computing circuits. The control-display device is provided with a connection location capable of being freely connected to and disconnected from the main body of the apparatus through the use of a cable and multi-pin plug and socket. The cable is electrically located midway along those circuits of the wiring routes between the engine-equipped apparatus and the control-display device in which the signals are in an analog state, whereby, through the connection and disconnection as desired of a separate multi-core cable having at least one plug and socket of the same type between the aforementioned plug and socket, selection can be made between dcirect connection of the device to the engine-equipped apparatus and positioning of the display device in a location separated from the engine-equipped apparatus.

10 Claims, 4 Drawing Sheets

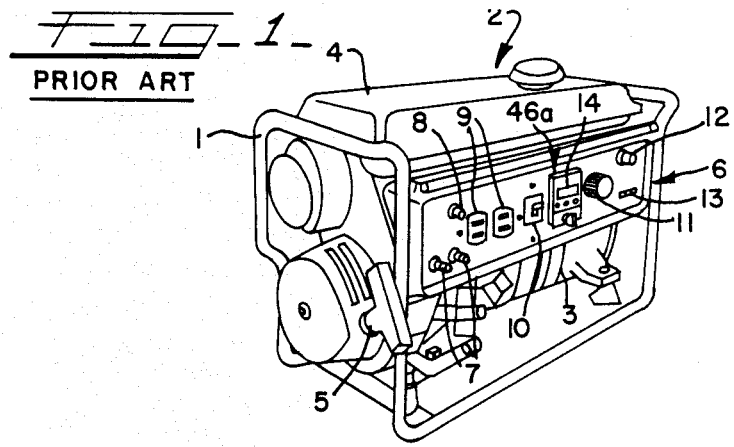
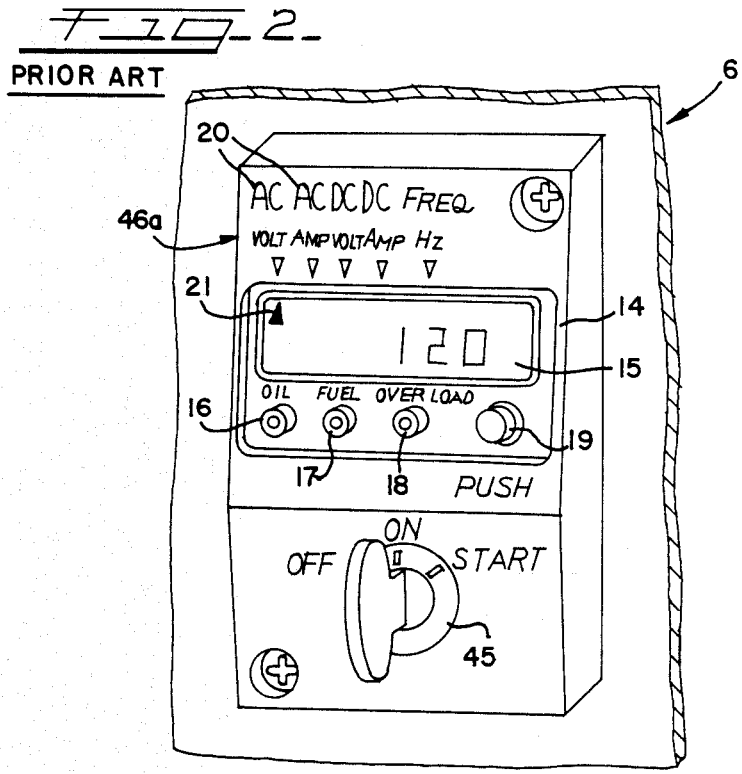
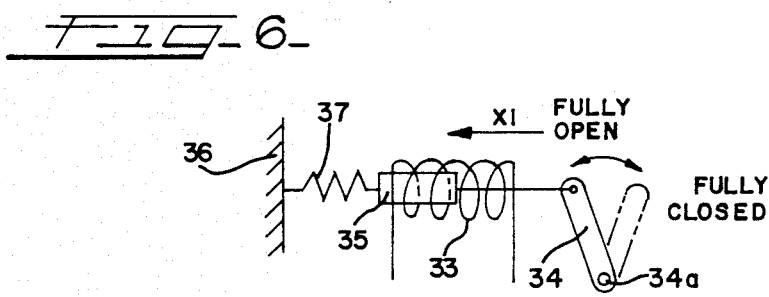

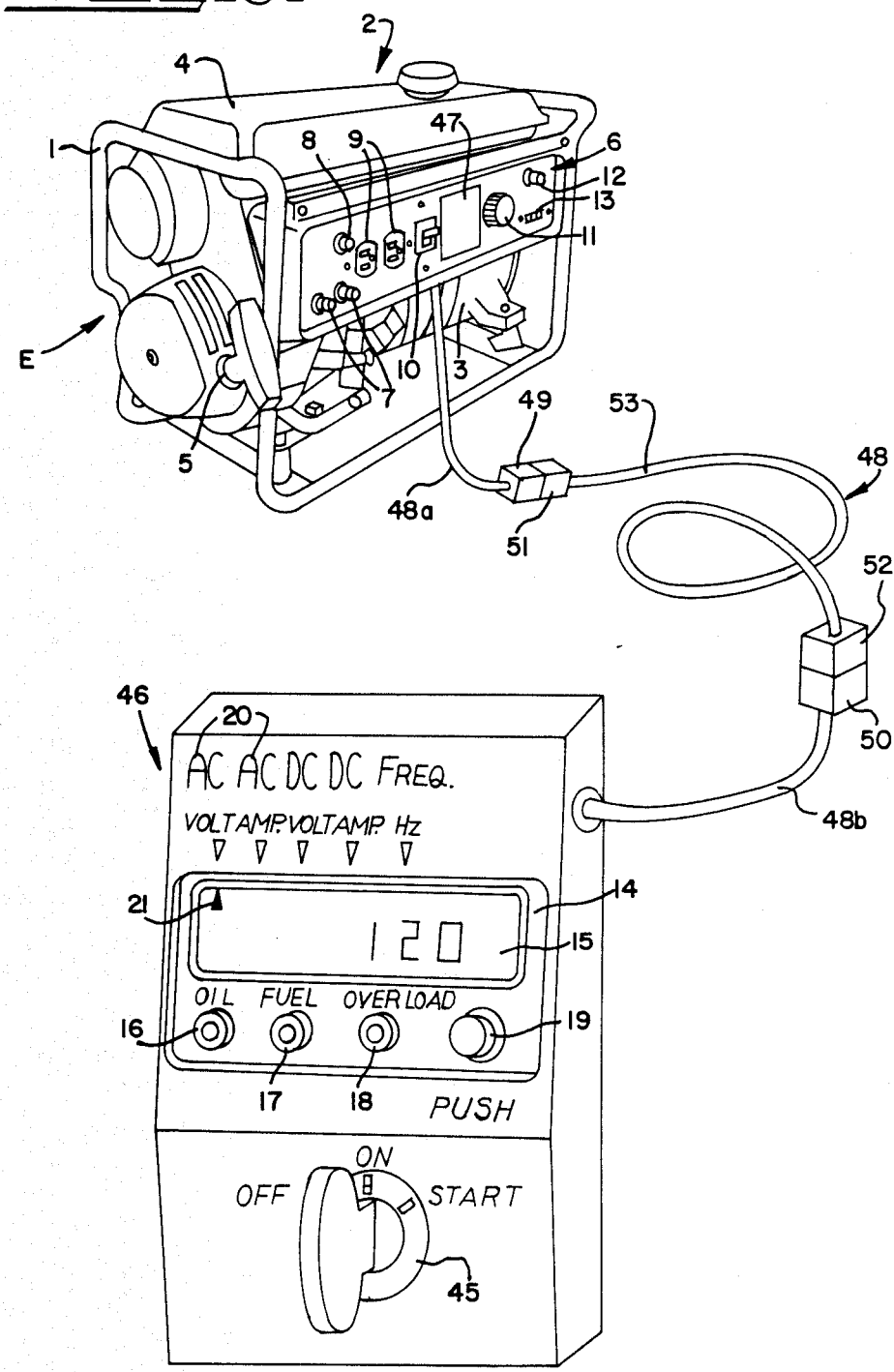

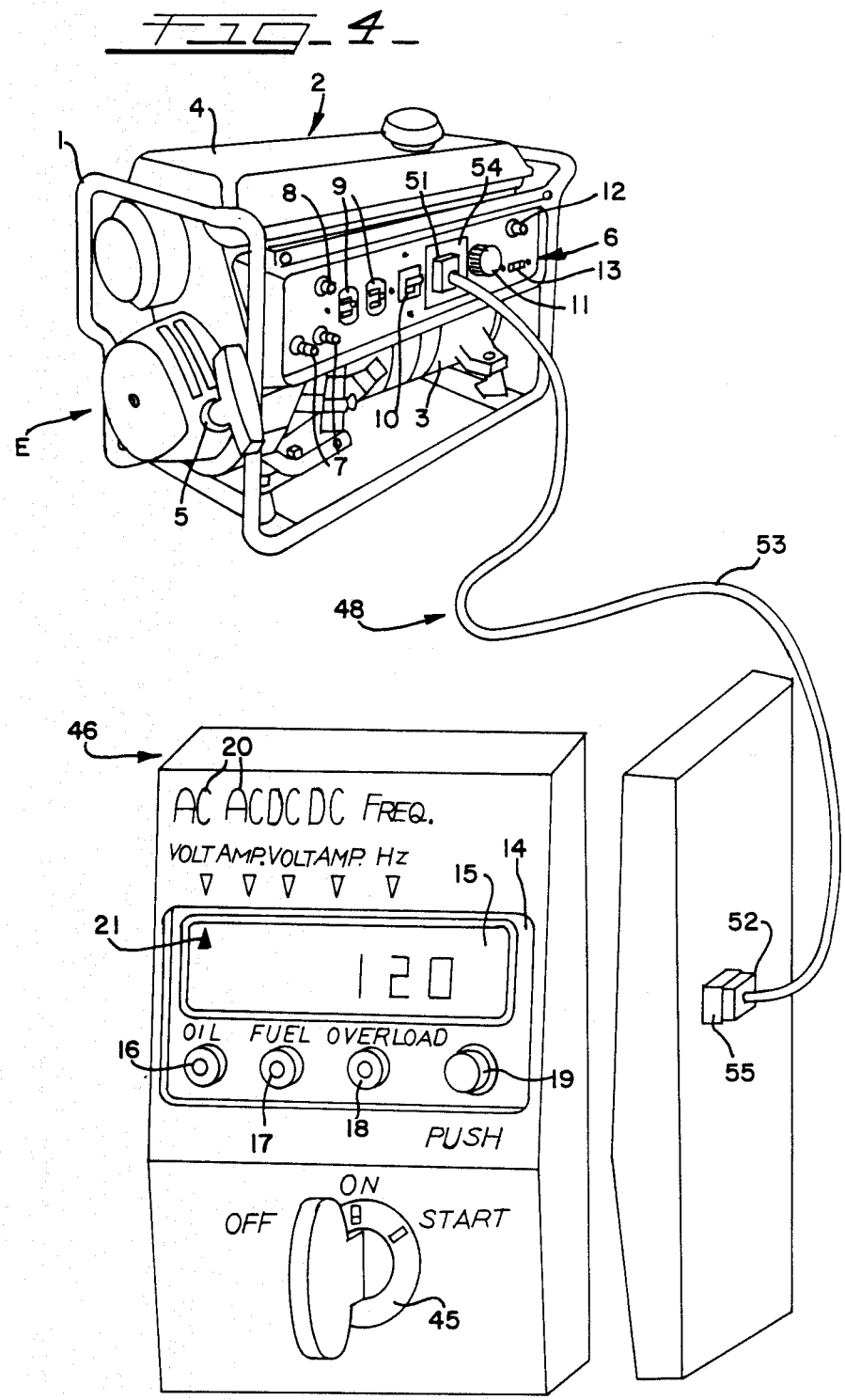

CONTROL-DISPLAY DEVICE FOR AN ENGINE-EQUIPED APPARATUS

FIELD AND BACKGROUND OF THE INVENTION

This invention relates to an engine-equipped apparatus, and more specifically to a control-display device for apparatus such as portable engine-generator sets used for powering pumps, compressors, chain saws, lawn mowers, etc.

Japanese patent application titled "Control Display Device for an Engine-equipped Apparatus" (Japanese Patent Provisional Publication Sho. No. 61-1300), filed by the assignee, discloses an engine equipped apparatus wherein the controldisplay device is mounted directly onto the apparatus. Consequently the operating conditions can only be read from a position close to the apparatus. In other words, the operating conditions of the apparatus being operated outdoors could not be read from indoors.

Generally speaking, bringing the engine start and stop functions of such an engine-equipped apparatus indoors via a cable, and bringing a voltmeter (conventional analog type instrument) to display the output voltage indoors via a cable, would be considered to be an easy task technologically. However, when dealing with a control-display device containing computing circuits, such as described in the aforementioned Japanese Patent Provisional Publication Sho. No. 61-1300, the extension of the cable generally results in considerable change in the transmission data, and therefore it has not been considered practical to bring the control-display device indoors via an extension cable.

It is a general object of this invention to, when using a control-display device containing computing circuits for an engine-equipped apparatus, make it possible, from a location indoors, for example, to check the operating conditions and to perform such functions as starting, operating, and stopping (this includes all other necessary functions) of the apparatus.

SUMMARY OF THE INVENTION

This invention relates to engine-equipped apparatus including a control-display device which contains computing circuits into which is fed such data as the AC amperage data from an apparatus having an AC generator, and means for displaying the data converted by these computing circuits. The control-display device is provided with a connection location capable of being freely connected to and disconnected from the main body of the apparatus through the use of a cable and multi-pin plug and socket. The cable is electrically located midway along those circuits of the wiring routes between the engine-equipped apparatus and the control-display device in which the signals are in an analog state, whereby, through the connection and disconnection as desired of a separate multi-core cable having at least one plug and socket of the same type between the aforementioned plug and socket, selection can be made between direct connection of the device to the engine-equipped apparatus and positioning of the display device in a location separated from the engine-equipped apparatus.

BRIEF DESCRIPTION OF THE DRAWINGS

This invention will be better understood from the following detailed description taken in conjunction with the accompanying FIGS. of the drawings, wherein:

FIG. 1 shows a prior art engine-equipped apparatus;
FIG. 2 shows a control-display device of the apparatus shown in FIG. 1;
FIG. 3 shows a perspective view of apparatus according to this invention;
FIG. 4 is similar to FIG. 3 but shows an alternative embodiment of the apparatus;
FIG. 6 shows a schematic diagram of an electronically-controlled governor of the apparatus of FIGS. 3 to 5.

DETAILED DESCRIPTION OF THE DRAWINGS

Figure 5:
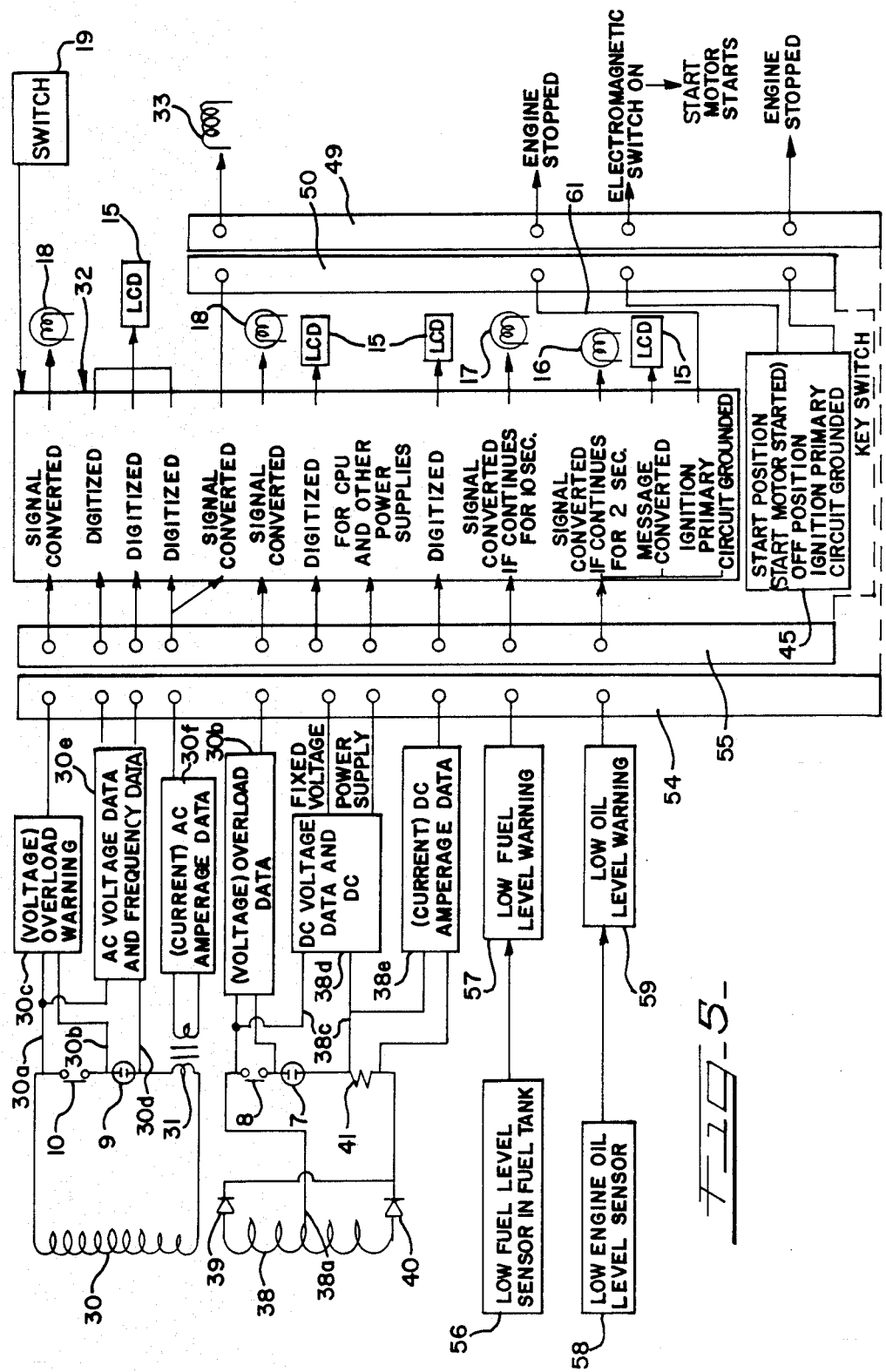
FIG. 5 shows a schematic diagram of apparatus according to this invention.

FIGS. 1 and 2 show the prior art engine-generator set described in Japanese Patent Provisional Publication Sho. No. 611300. The body 2 of the set is mounted in a pipe frame 1. The body 2 includes a generator 3, a fuel tank 4, a starter 5, an internal combustion engine (not shown in the drawings), etc., and a control panel 6 is mounted on the pipe frame 1 at one side of the body 2. The control panel 6 is equipped with DC output terminals 7, a DC circuit breaker 8, AC output sockets 9, an AC circuit breaker 10, a throttle knob 11, a pilot lamp 12, an engine stop switch 13, and an LCD display panel 14 mounted on a device 46a shown in FIG. 2.

As shown in FIG. 2, below an LCD window 15 of the device 46a are located, from the left, a low oil level warning lamp 16, a low fuel level warning lamp 17, an overload warning lamp 18, and a button switch 19 for changing the display mode of the panel 14. In addition, letters 20 which indicate the various display modes are printed on the face of the device 46a above the LCD window 15, and an indicator mark 21 inside the LCD window 15 indicates the selected letter 20. For example, the display status shown in FIG. 2 indicates that an AC voltage of 120 volts is being generated.

The unitized control-display device 46a further includes an engine-start and engine-stop switch 45 for the IC engine.

As shown and described, the control device 46a is mounted on the control panel 6 of the main body, and, with this structure, there is the drawback described above of not being able to read the operating conditions and control the generator set without being in a position close to the set.

FIGS. 3, 4, and 5 show an engine-generator set E according to this invention. For the parts that are common with the prior art generator set shown in FIGS. 1 and 2, the same reference numerals are used. On the control panel 6 of the apparatus E is fastened a blank cover 47 in the location at which the prior art control-display device 46a is mounted, and a remote control-display device 46 is connected to the main body 2 of the apparatus E via a multi-core cable 48, thus making it possible to position the control-display device 46 several meters or more away from the main body 2. While the cable 48 may be a single piece, in the present example it is formed in two sections 48a and 48b (FIG. 3) which terminate in couplers 49 and 50. The couplers 49 and 50 may be coupled directly together or, as shown in FIG. 3, an extension cable 53 having couplers 51 and 52 may be fastened between the couplers 49 and 50. In the embodiment shown in FIG. 3, the cable section 48a is wired directly into the main body 2 and the cable section 48b is wired directly into the control device 46. In FIG. 4, another coupler 54 is mounted on the panel 6, the coupler 54 being wired into the body 2, and a coupler 55 is mounted on the device 46 and wired into it. Thus, the couplers 54 and 55 may be coupled directly together or one or more cable sections having similar mutually engageable couplers may be connected between the couplers 54 and 55 as shown in FIG. 4. In other words, one or more (or no) extension cables 53 may be provided in the systems of FIGS. 3 and 4.

Therefore, when using the generator set, the control-display device 46 and the main body 2 are either connected via the couplers 49 and 50 (FIG. 3), or via the coupler 54 located on the panel and the coupler 55 on the device. To lengthen the connection, the extension cable 53 having the couplers 51 and 52 may be connected between the display device 46 and the main body 2. The multi-core cable section 48a (FIG. 3) on the main body 2 and the multi-core cable section 48b can either be connected directly via the couplers 49 and 50, or, as shown in FIG. 3, they can be connected via the extension cable 53. Or, it is also possible to connect the coupler 51 to the coupler 54 and connect the coupler 52 to the coupler 55 provided on the panel or connect the couplers 54 and 55 directly (FIG. 4).

With reference to FIG. 5, the electrical system for the apparatus E includes computing circuits 32 in a CPU mounted in the remote control-display device 46, and power and control circuits in the main body 2. The circuits in the main body 2 to which the cable 48 (including the extension cable 53) is connected are the circuits which immediately precede the circuits (located in the device 46) which convert and adjust the data output from the main body 2 to the computing circuits 32 contained in the control and display device 46, and the signals of these circuits passing through the cable are in the analog state, not yet having been converted to the digital state for computation and display purposes. In other words, the structure is designed in such a manner as to allow the extension cable 53 to be freely connected or disconnected between the couplers 49 and 50 shown in FIG. 5 and carry the analog signals which are not as easily distorted as digital signals.

The I.C. engine in the engine-equipped apparatus E is an electric motor-starting type, and a battery for driving the start motor is also included on the engine-equipped apparatus E. The engine-start and engine-stop switch 45 for driving the motor can be installed on the control-display device 46. The main body part of the engine-equipped apparatus E is connected to the remote device 46 via the couplers 49 and 50 (or 54 and 55) as described, and in addition, the engine-equipped apparatus E may also be connected via other couplers in the cable.

The portable engine-generator set described above in connection with FIGS. 3 and 4 further includes the electrical-control circuits shown schematically in FIG. 5. One end of the generator's AC power output winding 30 is connected to one terminal of the AC circuit breaker 10, and the other terminal of the circuit breaker 10 is connected to one of the terminals of the AC power output socket 9. The other end of the output winding 30 is connected to the other output terminal of the output socket 9 via a current transformer 31.

There is a branch line 30a between the output winding 30 and the circuit breaker 10, and also a branch line 30b between the circuit breaker 10 and the output socket 9, thus allowing the voltage across the two terminals of the circuit breaker 10 to be inputted to a circuit 30c for developing a voltage signal which is fed to the computing circuits 32 (CPU) as an overload warning signal. This overload warning signal undergoes signal conversion from analog to digital in the computing circuits 32, and in addition to activating (causing it to light up or flash on and off) the overload warning lamp 18, it also causes the display in the LCD window 15, to be described later, to flash on and off.

There is another branch line 30d between the transformer 31 and the socket 9. The voltage between the branch lines 30a and 30d is inputted to a circuit 30e for developing an analog signal which is fed to the computing circuits 32 as the AC voltage data and the AC frequency data. These data are fed in analog form through the cable and couplers to the computing circuits 32, and then displayed as a numerical value in the LCD window 15 during the corresponding display mode.

The AC amperage data detected as current through the current transformer 31 is fed to a circuit 30f for developing an analog signal which is digitized in the computing circuits 32 as the AC amperage data display signal, and, at the same time, is also converted into a control signal for the throttle control solenoid coil 33. The AC amperage data display signal is displayed as a numerical value in the LCD window 15 during the corresponding display mode, and the control signal for the throttle control solenoid coil 33 is used to control the solenoid coil 33 of an electronically-controlled governor such as that shown in FIG. 6.

With reference to FIG. 6, the throttle lever 34 of the internal combustion engine (such as a gasoline engine) is fully open when in the position indicated by the solid lines, and is fully closed when in the position indicated by the dash-dot-dot lines. Thus the operating speed of the engine can be freely changed by swinging the lever 34 on its pivot pin 34a. The top of the lever 34 is linked via a solenoid plunger 35 to a governor spring 37, the plunger 35 and the spring 37 being connected between the lever 34 and a frame 36. Thus the top of the lever 34 is pulled in the direction indicated by the arrow $X_1$ by the tensile force of the spring 37.

The throttle control solenoid coil 33 is wound around the plunger 35, separated by a certain amount of clearance so the plunger can move. By pulling the plunger 35 in the reverse direction of that indicated by the arrow $X_1$ in accordance with the voltage across the coil and the amount of current through the coil 33, the swinging of the throttle lever 34 can be controlled. The control signal fed to the CPU 32 for the throttle-control solenoid 33 mentioned above controls the size of the voltage applied to the solenoid coil 33, thus controlling the operating speed of the engine. In other words, when the load connected to the AC output socket 9 is normal, the execution of the primary governor function by the governor shown in FIG. 6 controls the opening and closing of the throttle in order to maintain a fixed engine operating speed, but when there is no load, the control signal converted by the computing circuits of the CPU 32 acts upon the throttle control solenoid 33 to cause the throttle lever 34 to move toward the fully closed side in order to set the engine to an idling speed.

The electric generator further includes a DC output winding 38 shown in FIG. 5, and both ends of the DC output winding 38 are connected to one of the output terminals of the DC output socket 7 via forward-direction diodes 39 and 40 for full-wave rectification and a shunt coil 41. In addition, a center tap 38a of the output winding 38 is connected to the other output terminal of the DC output socket 7 via the DC circuit breaker 8. The voltage across the circuit breaker 8 is fed to an analog developing circuit 38b for generating an overload warning signal. The overload warning signal undergoes signal conversion to digital form in the computing circuits 32, and, in addition to activating the overload warning lamp 18, it also causes the display in the LCD window 15 to flash on and off.

Furthermore, the voltage between the center tap 38a and the shunt coil 41 side of the output socket 7 is fed by lines 38c to a circuit 38d for developing an analog DC voltage signal which is fed to the CPU 32 and digitized in the computing circuits as the DC voltage data. In addition to being displayed as a numerical value in the LCD window 15 during the DC voltage display mode, this voltage is also used as the fixed-voltage DC power supply for the computing circuits in the CPU 32, for the throttle-control solenoid 33, etc.

The very small current value shunted by the shunt coil 41 is fed to another circuit 38e which develops a DC amperage signal which is fed to the computing circuits in the CPU 32 as the DC amperage data, where it is digitized for display as a numerical value in the LCD window 15.

In addition, the signal from a low fuel level sensor 56 located inside the engine fuel tank is fed to a circuit 57 for developing an analog signal which is fed to the computing circuits in the CPU 32 as the low fuel level data. The duration of existence of a low fuel level signal is measured in the computing circuits, and if the signal continues for longer than, for example, 10 seconds, the signal is converted in the CPU in order to both activate the low fuel level warning lamp 17 and also to cause the display in the LCD window 15 to flash on and off.

In addition, a signal from a low engine oil level sensor 58 located inside the engine's oil pan is fed to a circuit 59 for developing an analog signal which is fed to the computing circuits in the CPU 32 as the low oil level data. The duration of this low oil level signal is counted in the computing circuits, and if the signal indicating a low oil level continues for longer than, for example, 2 seconds, the signal is processed as follows. The low oil level signal is converted in order to both activate the low oil level warning lamp 16, and, at the same time, the signal is also converted into a message such as "OIL" which is displayed in the LCD window 15. Furthermore, the low oil level signal is fed on a line 61 to a circuit for causing the engine's ignition primary circuit to be grounded, thus automatically stopping the engine if the oil level is low. Note that, regardless of the display mode, this "OIL" indication causes the display mode indication to be erased and replaces it in the LCD window 15.

Thus, all of the signals from the circuits 30c, 30e, 30f, 38b, 38d, 38e, 57 and 59 (which are located in the main body 2) are in analog form and are fed through the wires in the multicore cable 48 to the CPU 32 contained in the remote display-control device 46. The couplers or plugs 49 and 50 (or 54 and 55) of the cable are shown in FIG. 5. It will be noted that the throttle-control signal to the coil 33 and the ignition primary grounding signal to stop the engine are fed back through the cable 48 and the couplers 49 and 50 to circuits in the main body 2. The latter two signals are converted from digital to analog form in the CPU 32 before being fed back through the cable. In addition, the start and off signals in analog form from the control switch 45 are fed from the remote device 46 through the cable to the main body 2.

The following is an explanation of the operation of the invention.

When the generator shown in FIG. 3, for example, is started, a number from 0 to 9999 (generated by the CPU 32) appears in the LCD window 15 shown in the lower half of FIG. 3, and the indicator mark 21 which indicates the letters 20 above the window also appears. The condition shown in FIG. 3 indicates that an AC voltage of 120 volts is being generated. This is the result of the AC voltage data obtained from the AC output winding 30 shown in FIG. 5 being digitized in the computing circuits 32 and displayed as a numerical value in the LCD window 15.

At this time, the display mode can be changed by pressing the button switch 19. In other words, each time the button switch 19 (which is connected to the CPU 32) is pressed, a different data digitized in the computing circuits of the CPU 32 is selected by a display control circuit included in the computing circuits. Then, for each of the modes shown in FIG. 3, in order from the left, the AC voltage data, the AC amperage data, the DC voltage data, the DC amperage data, and the AC frequency data will be displayed in the LCD window 15 one at a time, sequentially, by pressing the button 19, and then, after a spare mode, the display will return to the AC voltage display mode. The indicator mark 21 will change indication positions in accordance with the changes in the display mode, moving along the upper edges of the LCD window 15, thus informing the user which of the data is indicated by the numerical value currently being displayed.

In the event that there is an overload and either the AC circuit breaker 10 or the DC circuit breaker 8 shown in FIG. 5 becomes open, an overload warning signal (minor warning data) is fed to the computing circuits 32, where it undergoes signal conversion to digital form. In addition to causing the overload warning lamp 18 to light up (or flash on and off if desired), this signal also acts upon the display-control circuit in the computing circuits 32 in order to cause the display in the LCD window 15 to flash on and off, thus informing the user that there is a minor problem and that this problem is being caused by an overload.

When the low fuel level signal (minor warning data) is fed to the computing circuits 32 from the low fuel level sensor, first the duration of the signal is counted in the computing circuits 32. If the signal continues for longer than, for example 10 seconds, the signal is converted so that it both causes the low fuel level warning lamp 17 to light up (or flash on and off) and the display in the LCD window 15 to flash on and off, thus informing the user that the fuel level is low. In this case, because the actions of the warning lamp 17 and the display occur only if the signal duration count exceeds the prescribed time, false warnings which might result simply from fluctuations in the fuel level caused by vibration, etc., are prevented.

In the same manner, when the low engine oil level signal (major warning data) is fed to the computing circuits 32 from the low oil level sensor, first the duration of the signal is counted in the computing circuits 32. If the signal continues for longer than, for example, 2 seconds, the signal is converted so that it both causes the low fuel level warning lamp 16 to light up (or flash on and off), and also acts upon the display control circuit in the computing circuits 32 in order to clear the normal data from the LCD window 15 and display the letters "OIL" instead. In this case, the engine's ignition primary circuit is also grounded in order to stop the engine.

Meanwhile, the AC amperage data detected by the current transformer 31 is digitized in the computing circuits 32 for display in the LCD window 15, and is also signal converted into the current used to operate the throttle-control solenoid 33. For example, if the equipment (for example, an electric drill or an electric planar) connected to the AC output sockets 9 is stopped and the load is zero, the current detected by the current transformer 31 will also be zero. At this time, the current flowing to the throttle-control solenoid 33 shown in FIG. 6 will reach the maximum level, and the magnetic field generated by the solenoid 33 will pull the core 35 in the reverse direction of that indicated by the arrow $X_1$, thus overcoming the tensile force of the governor spring 37 and causing the throttle lever 34 to swing to the fully closed position and set the engine to the idling condition.

Next, when the electric drill or other equipment is operated and a load is applied, the AC amperage data corresponding to the size of the load is detected by the current transformer 31 shown in FIG. 5, and this data is digitized in the computing circuits 32 so that it can be displayed. At the same time, this AC amperage data is signal converted, and the electronically-controlled governor shown in FIG. 6 recovers its primary governor function, i.e. the function of controlling the opening and closing of the throttle in order to maintain the engine operating speed at a fixed level.

In order to drive the motor, the switch 45 is set to the "START" position, and after the engine starts, the switch 45 remains in the "ON" position. In order to stop the engine, the switch 45 is set to the "OFF" position.

The various sensors and analog signal generating circuits shown in FIG. 5 of the main body 2, and the circuits of the remote control-display device 46 may have conventional designs.

With this invention, it is possible, from a location remote from the main body 2 such as indoors, to check the operating conditions and perform such functions as starting, operating, and stopping (including all other necessary functions) of an engine-equipped apparatus E located outdoors. Moreover, with this invention, this is accomplished by a multi-function display device which contains computing circuits. The cable 48 may include one or more extensions as well as plugs or couplers, but because the signals in the cable are in analog form and not in digital form, the cable and the couplers do not distort or otherwise disrupt the signals. The circuits for converting the analog signals to digital form are located in the remote control-display device adjacent the displays and controls.

What is claimed is:

1. A control-display device for an engine-equipped apparatus, said apparatus including analog signal generating circuits and a control mechanism for controlling the operation of the engine, said device comprising computing circuits for converting said analog signals to digital form, digital means for generating a control signal in digital form, means for converting said control signal from digital form to analog form, and coupler means connectable to said analog signal generating circuits and connected to said computing circuits in said device, said coupler means further being connected to said control mechanism and to said converting means and carrying said control signal in analog form, whereby said coupler means is located midway along those circuit of the wiring routes between the engine-equipped apparatus and said display device at which the signals are in analog state, whereby said display device is positionable at a location selectively on or separated from the engine-equipped apparatus.

2. A control-display device as set forth in claim 1, wherein said coupler means comprises a multicore cable including a plug and a socket between said device and said apparatus.

3. A control-display device as set forth in claim 2, and further including a multicore extension cord having a plug and a socket similar to said plug and said socket of said cable, whereby said device may be connected directly to said apparatus by said cable or connected via said cable and said cord.

4. A control-display device as set forth in claim 2, wherein said plug and said socket are connected in said cable between said device and said apparatus.

5. A control-display device as set forth in claim 1, wherein said coupler means comprises a coupler on said device and another coupler on said apparatus.

6. A system comprising a control-display device, an engine-equipped apparatus, said apparatus including analog signal generating circuits and a control mechanism for controlling the operation of the engine, said device comprising computing circuits for converting said analog signals to digital form, digital means for generating a control signal in digital form, means for converting said control signal from digital form to analog form, and a multicore cable connectable to said analog signal generating circuits and connected to said computing circuits in said device, said cable further being connected to said control mechanism and to said converting means and carrying said control signal in analog form, said cable including a plug and a socket between said device and the apparatus, whereby said cable is located midway along those circuits of the wiring routes between the engine-equipped apparatus and said display device at which the signals are in analog state, whereby said display device is positionable at a location separated from the engine-equipped apparatus.

7. A system as set forth in claim 6, and further including a multicore extension cord having a plug and a socket similar to said plug and said socket of said cable, whereby said device may be connected directly to said apparatus by said cable or connected via said cable and said cord.

8. A system as set forth in claim 6, wherein said plug and said socket are connected in said cable between said device and said apparatus.

9. A system as set forth in claim 6, wherein said plug and said socket are on said device and further including another plug and socket on said apparatus.

10. Apparatus according to either of claims 1 or 6 wherein said control mechanism includes an engine-stop switch, a cell motor start switch, a pilot lamp, and a voltage adjustment knob.

* * * * *